US011961755B2

(12) United States Patent
Ishikawa

(10) Patent No.: US 11,961,755 B2
(45) Date of Patent: Apr. 16, 2024

(54) SUBSTRATE SUPPORT AND SUBSTRATE PROCESSING APPARATUS

(71) Applicant: Tokyo Electron Limited, Tokyo (JP)

(72) Inventor: Shinya Ishikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 17/649,968

(22) Filed: Feb. 4, 2022

(65) Prior Publication Data

US 2022/0254671 A1   Aug. 11, 2022

(30) Foreign Application Priority Data

Feb. 5, 2021 (JP) ................................. 2021-017461
Jan. 27, 2022 (JP) ................................. 2022-010748

(51) Int. Cl.
*H01L 21/683* (2006.01)
*H01J 37/32* (2006.01)

(52) U.S. Cl.
CPC .... *H01L 21/6833* (2013.01); *H01J 37/32174* (2013.01); *H01J 37/32642* (2013.01); *H01J 37/32724* (2013.01)

(58) Field of Classification Search
CPC .................................................. H01L 21/6833
See application file for complete search history.

(56) References Cited

U.S. PATENT DOCUMENTS

| 2009/0165956 | A1* | 7/2009 | Nam .................... H01L 21/6831 118/500 |
| 2012/0281334 | A1* | 11/2012 | Sasaki ............... H01J 37/32642 361/234 |
| 2016/0035610 | A1* | 2/2016 | Park .................... H01L 21/6833 165/80.2 |
| 2016/0198528 | A1* | 7/2016 | Kitagawa .......... H01L 21/67109 156/345.52 |
| 2017/0018411 | A1* | 1/2017 | Sriraman .......... H01J 37/32715 |
| 2017/0318627 | A1* | 11/2017 | Won .......................... F27D 7/06 |
| 2019/0206703 | A1* | 7/2019 | Zhao ................. H01J 37/32174 |

FOREIGN PATENT DOCUMENTS

JP    2013-172013 A    9/2013

\* cited by examiner

*Primary Examiner* — Sherman Ng
(74) *Attorney, Agent, or Firm* — Pearne & Gordon LLP

(57) ABSTRACT

A substrate support includes a substrate support portion having an electrostatic chuck for adsorbing a substrate and a substrate heater electrode inside the electrostatic chuck; a ring support supporting an edge ring and having an edge ring heater electrode inside; a base having a central stage on which the substrate support portion is disposed, and an outer peripheral stage on which the ring support is disposed; a first power feeding terminal disposed immediately below the substrate support portion to supply a power to the substrate heater electrode; and a second power feeding terminal disposed immediately below the ring support to supply the power to the edge ring heater electrode. An upper surface of the outer peripheral stage is positioned lower than that of the central stage, and a thickness of the ring support is equal to or larger than 40% of a thickness of the substrate support portion.

16 Claims, 4 Drawing Sheets

SUBSTRATE SUPPORT AND SUBSTRATE PROCESSING APPARATUS

CROSS-REFERENCE TO RELATED APPLICATION

This application claims priorities to Japanese Patent Application No. 2021-017461, filed on Feb. 5, 2021, and Japanese Patent Application No. 2022-010748, filed on Jan. 27, 2022, the entire contents of which are incorporated herein by reference.

TECHNICAL FIELD

The present disclosure relates to a substrate support and a substrate processing apparatus.

BACKGROUND

Patent Document 1 discloses a substrate processing apparatus that includes a base disposed in an interior of a processing container and provided with a coolant passage extending to an inlet and an outlet in the interior, and a stage provided on an upper surface of the base through an adhesive and having an electrostatic chuck provided with a heater in the interior or on a lower surface thereof.
Patent Document 1: Japanese Patent Laid-open Publication No. 2013-172013

SUMMARY

According to an aspect of the present disclosure, there is provided a substrate support for supporting a substrate and an edge ring on an upper surface, the substrate support including: a substrate support portion having an electrostatic chuck for adsorbing the substrate and a substrate heater electrode in the electrostatic chuck; a ring support supporting an edge ring disposed to surround the substrate and having an edge ring heater electrode inside; a base having a central stage on which the substrate support portion is disposed and an outer peripheral stage on which the ring support is disposed on an outer peripheral side of the central stage; a first power feeding terminal disposed immediately below the substrate support portion to supply a power to the substrate heater electrode; and a second power feeding terminal disposed immediately below the ring support to supply the power to the edge ring heater electrode, wherein an upper surface of the outer peripheral stage is positioned lower than an upper surface of the central stage, and a thickness of the ring support is equal to or larger than 40% of a thickness of the substrate support portion.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
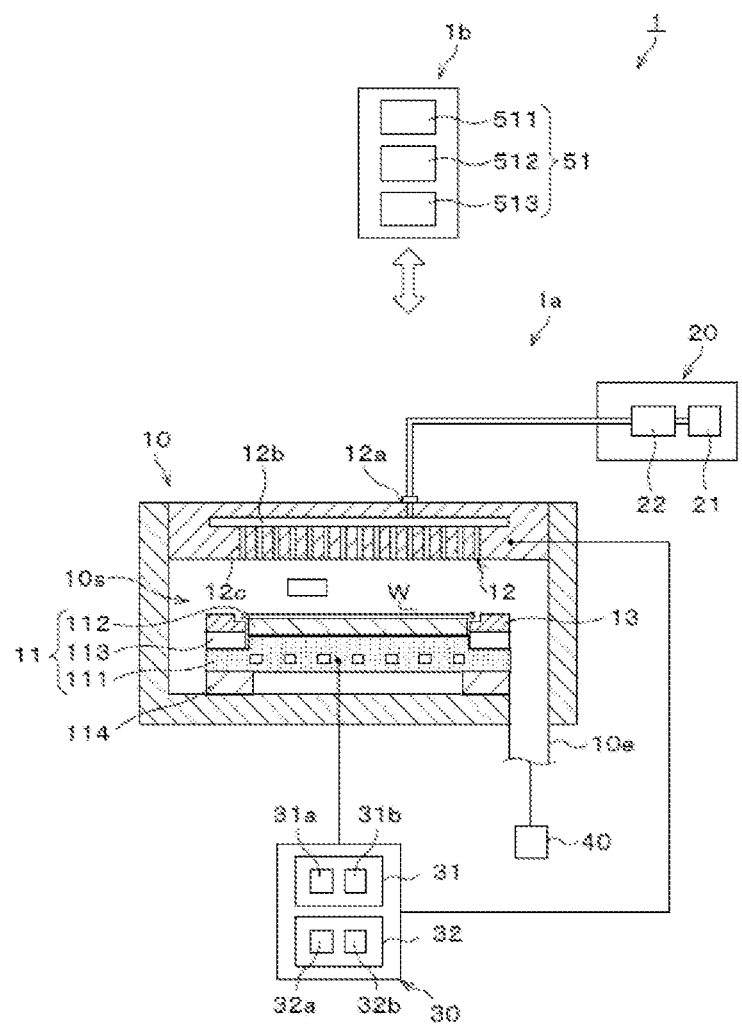
FIG. 1 is a vertical sectional view schematically illustrating an outline of a configuration of a plasma processing system of the present embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In a manufacturing process of a semiconductor device, a plasma processing apparatus generates a plasma by exciting a processing gas, and a semiconductor substrate placed on a stage (hereinafter, referred to as a "substrate") is processed by means of the plasma. The stage on which the substrate is placed is provided with an electrostatic chuck that adsorbs and holds the substrate on a stage surface by, for example, a Coulomb force or the like.

In the meantime, as disclosed in Patent Document 1, an edge ring (also referred to as a "focus ring") that surrounds a periphery of the substrate adsorbed and held on the stage surface is provided in the stage provided inside a chamber of the plasma processing apparatus. Since the edge ring is exposed to the inner space (plasma processing space) of the chamber during the plasma processing, the edge ring is consumed by the influence of plasma generated in the plasma processing space.

As a countermeasure against the consumption of the edge ring during the plasma processing, for example, increasing of the thickness of the edge ring or the thickness of a ring holding member that holds the edge ring on an upper surface of the stage is given as an example. For example, by increasing of the thickness of the edge ring itself, it is possible to increase a margin with respect to the amount of consumption until the thickness that requires replacement of the edge ring is reached; that is, it is possible to prolong the life of the edge ring. Further, for example, by increasing of the thickness of the ring holding member, an impedance ratio with respect to the substrate or the electrostatic chuck is changed, which may reduce the plasma that acts on the edge ring during the plasma processing. In other words, the influence of the plasma on the edge ring is reduced, and thus the amount of consumption of the edge ring is reduced.

However, in a structure of the stage according to the related art disclosed in Patent Document 1, it is not possible to increase the thickness of the edge ring or the ring holding member, so that it is not possible to appropriately prolong the life of the edge ring or reduce the amount of consumption of the edge ring. Specifically, in the structure of the stage according to the related art as disclosed in Patent Literature 1, it is not possible to change the position at which the electrostatic chuck and the ring holding member are attached to the base of the stage. That is, it is difficult to independently change the thicknesses of the edge ring and the ring holding member. In this way, from the viewpoints of reducing the amount of consumption of the edge ring and prolonging the life of the edge ring, there is room for improvement in the structure of the stage according to the related art.

The present disclosure has been made in view of the above-described circumstances, and in an edge ring disposed around a substrate supported by a substrate support, the amount of consumption of the edge ring during plasma processing is appropriately reduced. Hereinafter, a plasma processing system as a substrate processing apparatus including a stage according to an embodiment will be described with reference to the drawings. The same reference numerals will be given to elements having substantially the same functional configurations throughout the specification and the drawings, and redundant description thereof will be omitted.

<Plasma Processing System>

First, a plasma processing system as a substrate processing apparatus of the present embodiment will be described. FIG. 1 is a vertical sectional view schematically illustrating an outline of a configuration of a plasma processing system 1. The plasma processing system 1 includes a capacitively-coupled plasma processing apparatus, and performs plasma processing such as etching, film formation, and diffusion on a substrate W to be processed.

In an embodiment, the plasma processing system 1 includes a plasma processing apparatus 1a and a controller 1b. A plasma processing apparatus 1a includes a plasma processing chamber 10, a gas supply 20, a power source 30, and an exhaust system 40. Further, the plasma processing apparatus 1a includes a stage 11 and an upper-electrode shower head 12 of the present embodiment. The stage 11 is disposed in a lower region of a plasma processing space 10s in the plasma processing chamber 10. The upper-electrode shower head 12 is disposed above the stage 11 and may function as a part of a ceiling of the plasma processing chamber 10.

The stage 11 serving as the substrate support includes a base 111, an electrostatic chuck 112 disposed on an upper surface of a central portion of the base 111 and having a stage surface of the substrate W, and a ring holding member 113 disposed on an upper surface of an outer peripheral portion of the base 111 and having a stage surface of an edge ring 13 described later. The stage 11 is fixed to a floor surface of the plasma processing chamber 10 through a stage base 114. A detailed configuration of the stage 11 will be described later.

The edge ring 13 formed in an annular shape is provided on a stage surface of the ring holding member 113 in a manner that surrounds the stage surface of the substrate W on the electrostatic chuck 112 in a plan view. In an example, the edge ring 13 is provided to improve uniformity of the plasma processing. The edge ring 13 is made of a material selected as appropriate according to the plasma processing to be performed, and may be made of, for example, silicon, silicon carbide (SiC), or quartz.

The upper surface of the substrate W placed on the placement surface of the electrostatic chuck 112 and the upper surface of the edge ring 13 placed on the placement surface of the ring holding member 113 preferably substantially coincide with each other in a plan view, as shown in FIG. 1.

The upper-electrode shower head 12 is configured to supply one or more processing gases from the gas supply 20 into the plasma processing space 10s. In an embodiment, the upper-electrode shower head 12 includes a gas inlet 12a, a gas diffusion chamber 12b, and a plurality of gas outlets 12c. The gas inlet 12a is provide in fluid communication with the gas supply 20 and the gas diffusion chamber 12b. The plurality of gas outlets 12c are provided in fluid communication with the gas diffusion chamber 12b and the plasma processing space 10s. In an embodiment, the upper-electrode shower head 12 is configured to supply one or more processing gases from the gas inlet 12a into the plasma processing space 10s through the gas diffusion chamber 12b and the plurality of gas outlets 12c.

The gas supply 20 may include one or more gas sources 21 and one or more flow rate controllers 22. In an embodiment, the gas supply 20 is configured to supply one or more processing gases from their corresponding gas sources 21 to the gas inlet 12a through their corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of one or more processing gases.

The power source 30 includes a radio frequency (RF) generator 31 coupled to the plasma processing chamber 10 via at least one impedance matching circuit. In an example, the RF generator 31 includes a first RF generator 31a configured to generate a source RF signal for generating plasma, and a second RF generator 31b configured to generate a bias RF signal for drawing ions in the plasma into the substrate W.

The first RF generator 31a is configured to be coupled to the stage 11 and/or the upper-electrode shower head 12 via at least one impedance matching circuit to generate the source RF signal (source RF power). As a result, plasma is formed from at least one processing gas supplied into the plasma processing space 10s. Accordingly, the first RF generator 31a may function as at least a part of a plasma generator. In one embodiment, the source RF signal has a frequency in the range of 27 MHz to 100 MHz.

The second RF generator 31b is configured to be coupled to the stage 11 via at least one impedance matching circuit to generate the bias RF signal (bias RF power). The second RF generator 31b may be coupled to the base 111, functioning as a lower electrode, as the stage 11, or may be coupled to a bias electrode (not illustrated) provided inside the electrostatic chuck 112. By supplying the bias RF signal to the stage 11, a bias potential is generated in the substrate W, and it is possible to draw ions in the plasma into the substrate W. A frequency of the bias RF signal may be the same as or different from a frequency of the source RF signal. In one embodiment, the bias RF signal has a lower frequency than the frequency of the source RF signal. In one embodiment, the bias RF signal has a frequency in a range of 100 kHz to 60 MHz. In one embodiment, the second RF generator 31b may be configured to generate a plurality of bias RF signals having different frequencies. Further, in various embodiments, at least one of the source RF signal and the bias RF signal may be pulsed.

Further, the power source 30 may include a DC power source 32 coupled to the plasma processing chamber 10. For example, the DC power source 32 includes a first DC generator 32a and/or a second DC generator 32b. In one embodiment, the first DC generator 32a is configured to be coupled to the stage 11 to generate a first DC signal. Similar to the bias RF signal, the first DC generator 32a may be coupled to the base 111 functioning as the lower electrode or may be coupled to the bias electrode provided in the electrostatic chuck 112. The generated first DC signal is applied to the stage 11. In one embodiment, the second DC generator 32b is configured to be connected to the upper-electrode shower head 12 to generate a second DC signal. The generated second DC signal is applied to the upper-electrode shower head 12.

In various embodiments, at least one of the first DC signal and the second DC signal may be pulsated. In this case, the first DC signal and/or the second DC signal, which are pulsated, (hereinafter, also referred to as "voltage pulse") are applied to the stage 11 and/or the upper-electrode shower head 12. The voltage pulse may have a pulse waveform of a rectangle, a trapezoid, a triangle or a combination thereof. In one embodiment, a waveform generator for generating the voltage pulse from the DC signal is connected between the first DC generator 32a and the stage 11. Accordingly, the first DC generator 32a and the waveform generator configure a voltage pulse generator. When the second DC generator 32b and the waveform generator configure the voltage pulse generator, the voltage pulse generator is connected to the upper-electrode shower head 12. The voltage pulse may have a positive polarity or a negative polarity. The first DC generator 32a may be provided together with the second RF generator 31b, or may be provided instead of the second RF generator 31b.

The exhaust system 40 may be connected to, for example, an exhaust port 10e disposed at a bottom portion of the plasma processing chamber 10. The exhaust system 40 may include a pressure valve and a vacuum pump. The vacuum pump may include a turbo molecular pump, a roughing pump or a combination thereof.

In an embodiment, the controller 1b processes computer-executable instructions to cause the plasma processing apparatus 1a to perform various processes to be described in the present disclosure. The controller 1b may be configured to control the respective components of the plasma processing apparatus 1a to perform the various processes to be described herein below. In an embodiment, a portion of the controller 1b or the entire controller 1b may be included in the plasma processing apparatus 1a. The controller 1b may include, for example, a computer 51. For example, the computer 51 may include a processing unit (central processing unit (CPU)) 511, a storage unit (SU) 512, and a communication interface (CI) 513. The CPU 511 may be configured to perform various control operations based on a program stored in the storage unit 512. The storage unit 512 may include a random access memory (RAM), a read only memory (ROM), a hard disk drive (HDD), a solid state drive (SSD), or a combination thereof. The communication interface 513 may communicate with the plasma processing apparatus 1a via a communication line such as a LAN (local area network).

<Stage>

Figure 2:
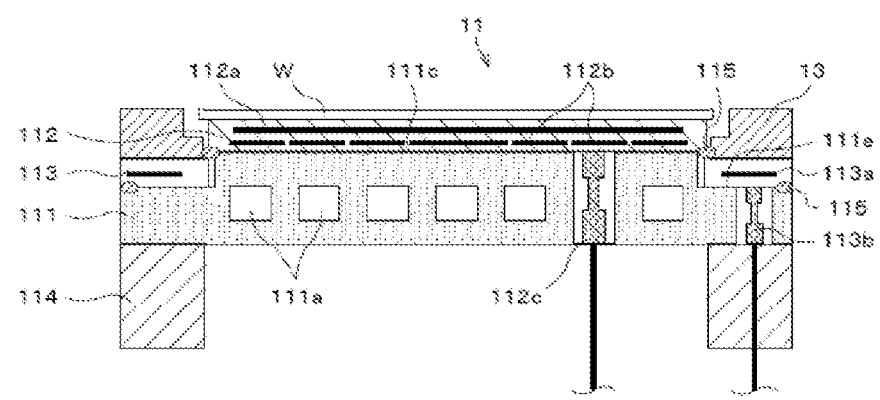
FIG. 2 is a vertical sectional view schematically illustrating an outline of a configuration of a stage of the present embodiment.
Figure 3:
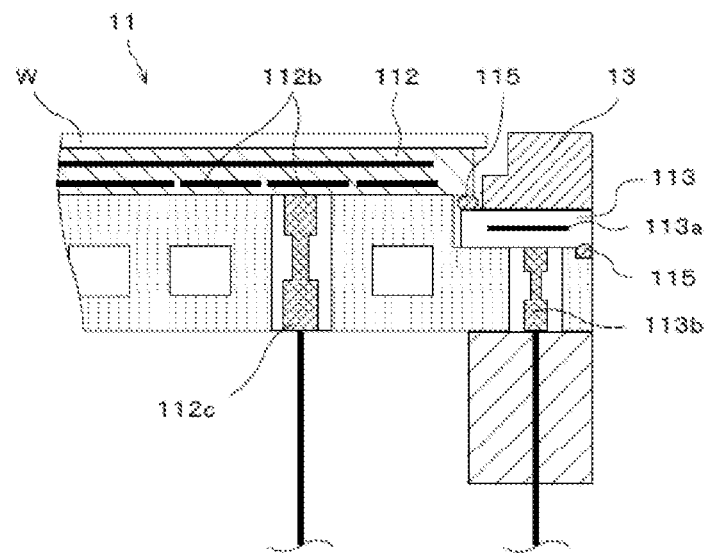
FIG. 3 is a main part enlarged view illustrating an enlarged main part of the stage shown in FIG. 2.

Next, the detailed configuration of the stage 11 described above will be described. FIG. 2 is a vertical sectional view schematically illustrating an outline of the configuration of the stage 11. FIG. 3 is a main part enlarged view illustrating an enlarged outer peripheral portion of the stage 11 illustrated in FIG. 2. As shown in FIG. 2, the stage 11 of the present embodiment includes the base 111, the electrostatic chuck 112, and the ring holding member 113.

The upper surface of the central portion of the base 111 forms a central stage 111c for placing the electrostatic chuck 112. Further, the upper surface of the outer peripheral portion of the base 111 forms an outer peripheral stage 111e for placing the ring holding member 113. An upper surface height of the central stage 111c is set to be higher than the upper surface height of the outer peripheral stage 111e. In other words, the ring holding member 113 is placed at a lower position of the base 111 than the electrostatic chuck 112 in a side view. Further, as shown in FIG. 3, an upper surface height position of the central stage 111c is preferably set to be higher than the upper surface height position of the ring holding member 113 placed on the outer peripheral stage 111e.

A coolant passage 111a is formed inside the base 111. A chiller unit (not illustrated) is connected to the refrigerant flow path 111a, and the refrigerant (e.g., cooling water) supplied from the chiller unit is circulated therein to cool the stage 11 and the substrate W placed on the stage 11 to a desired temperature.

The base 111 is made of, for example, aluminum, ceramic, or the like, and functions as a lower electrode in the plasma processing system 1.

The electrostatic chuck 112 configuring a substrate support portion is placed on the central stage 111c of the base 111 via, for example, an adhesive layer (not illustrated). The electrostatic chuck 112 has a stage surface for electrostatically adsorbing the substrate W on an upper surface. The electrostatic chuck 112 is made of, for example, a dielectric (hereinafter, also referred to as a "first dielectric") such as ceramic.

In addition to the substrate adsorption electrode 112a for adsorbing the substrate W, a substrate heater electrode 112b for heating the substrate W is provided inside the electrostatic chuck 112.

A DC power source (not illustrated; hereinafter, also referred to as an "adsorption power source") is connected to the substrate adsorption electrode 112a via, for example, a switch. The electrostatic chuck 112 can adsorb and hold the substrate W on the stage surface by a Coulomb force generated when a DC voltage is applied from the adsorption power source to the substrate adsorption electrode 112a.

A power source (not illustrated; hereinafter, also referred to as a "first heater power source") is connected to the substrate heater electrode 112b via, for example, a switch. The power source may be the DC power source or an AC power source. The substrate heater electrode 112b may be provided below the substrate adsorption electrode 112a and above the coolant passage 111a described above. A temperature of the substrate heater electrode 112b is raised by supplying of a power from the first heater power source, so that a temperature of the substrate W placed on the electrostatic chuck 112 is adjusted to a desired temperature. In the present embodiment, the electrostatic chuck 112 may be divided into a plurality of regions in a plan view. The plurality of regions may be, for example, substrate temperature-controlled regions Z shown in FIG. 4. Further, the substrate heater electrode 112b may be configured by a plurality of segment electrodes. In this case, each of the plurality of segment electrodes may be disposed for each of the plurality of regions. In this configuration, magnitudes of powers supplied to the respective segment electrodes may be configured to be independently controlled by the controller 1b. As a result, it is possible to independently adjust the temperature of the substrate W for each of the substrate temperature-controlled regions Z. The number of substrate temperature-controlled regions Z and shapes of the substrate temperature-controlled regions Z are not limited to the illustrated example, and can be arbitrarily set.

In one embodiment, the electrostatic chuck 112 may be configured by a first dielectric and a first electrode inside the first dielectric. The first electrode may include at least one electrode selected from the group consisting of the substrate adsorption electrode, the substrate heater electrode, and a substrate bias electrode. In an example, the electrostatic chuck 112 is configured by the first dielectric, and the substrate adsorption electrode and the substrate bias electrode inside the first dielectric. The substrate bias electrode may be connected to the second RF generator 31b or the first DC generator 32a via, for example, a switch. By supplying the bias RF signal or the first DC signal to the substrate bias electrode during the plasma processing, it is possible to draw ions in the plasma into the substrate W. In one embodiment, the electrostatic chuck 112 may further include the substrate heater electrode inside the first dielectric, in addition to the substrate adsorption electrode and the substrate bias electrode.

As shown in FIG. 2, the first power feeding terminal 112c is disposed on a lower side of the electrostatic chuck 112. The first power feeding terminal 112c may be disposed immediately below the electrostatic chuck 112. The first power feeding terminal 112c may be disposed inside a through-hole passing through the central stage 111c of the base 111 in a thickness direction. The first power feeding terminal 112c is configured to be able to supply a power to the substrate heater electrode 112b disposed inside the electrostatic chuck 112. The first power feeding terminal 112c may be configured to be able to supply the power to the substrate adsorption electrode 112a and/or the substrate bias electrode, together with the substrate heater electrode 112b or instead of the substrate heater electrode 112b. That is, the first power feeding terminal 112c may be configured to supply the power to at least one electrode selected from the group consisting of the substrate adsorption electrode, the substrate heater electrode, and the substrate bias electrode.

The ring holding member 113 serving as a ring support is placed on the outer peripheral stage 111e of the stage 11 via, for example, the adhesive layer (not illustrated). The ring holding member 113 may be configured to support the edge ring 13 via a glue (not illustrated) such as a polymer sheet. The ring holding member 113 is made of, for example, a dielectric (hereinafter, also referred to as a "second dielectric") such as ceramic.

An edge ring heater electrode 113a for heating the edge ring 13 is provided in the inside of the ring holding member 113.

A power source (not illustrated; hereinafter, also referred to as a "second heater power source") is connected to the edge ring heater electrode 113a via, for example, a switch. The power source may be the DC power source or an AC power source. The second heater power source may be the same as or different from the first heater power source. A temperature of the edge ring heater electrode 113a is raised by supplying of the power from the second heater power source, so that a temperature of the edge ring 13 placed on the ring holding member 113 is adjusted to a desired temperature. In the present embodiment, the edge ring heater electrode 113a may be disposed along a circumferential direction in the inside of the ring holding member 113. The number, shape, and disposition of the edge ring heater electrode 113a are not limited, and may be arbitrarily determined. For example, as the edge ring heater electrode 113a, a plurality of ring-shaped electrodes having different radii may be prepared, and the ring-shaped electrodes may be concentrically disposed inside the ring holding member 113.

In one embodiment, the ring holding member 113 may be configured by the second dielectric and a second electrode inside the second dielectric. The second electrode may include at least one electrode selected from a group consisting of the edge ring adsorption electrode, the edge ring heater electrode, and an edge ring bias electrode. Further, the second electrode may include at least two electrodes selected from the group consisting of the edge ring adsorption electrode, the edge ring heater electrode, and the edge ring bias electrode. In an example, the ring holding member 113 is configured by a second dielectric and an edge ring bias electrode inside the second dielectric. The edge ring bias electrode may be connected to the second RF generator 31b or the first DC generator 32a via, for example, a switch. When the bias RF signal or the first DC signal is supplied to the edge ring bias electrode during the plasma processing, it is possible to draw ions in the plasma into the edge ring 13. In one embodiment, the ring holding member 113 may further include the edge ring heater electrode inside the second dielectric in addition to the edge ring bias electrode. Further, as will be described later, when the ring holding member 113 is configured so that the edge ring 13 is supported by the electrostatic chuck, the edge ring adsorption electrode may be further provided inside the second dielectric.

As shown in FIG. 2, a second power feeding terminal 113b is disposed on a lower side of the ring holding member 113. The second power feeding terminal 113b may be disposed immediately below the ring holding member 113. The second power feeding terminal 113b may be disposed inside a through-hole passing through the outer peripheral stage 111e of the base 111 in the thickness direction. The second power feeding terminal 113b is configured to be able to supply the power to the edge ring heater electrode 113a disposed inside the ring holding member 113. The second power feeding terminal 113b may be configured to supply the power to the edge ring adsorption electrode and/or the edge ring bias electrode, together with the edge ring heater electrode 113a or instead of the edge ring heater electrode 113a. That is, the second power feeding terminal 113b may be configured to be able to supply the power to at least one electrode selected from the group consisting of the edge ring adsorption electrode, the edge ring heater electrode, and the edge ring bias electrode.

In the present embodiment, the edge ring 13 is placed on the outer peripheral stage 111e of the ring holding member 113 via the glue. However, a method for placing the edge ring 13 is not limited thereto. For example, when the edge ring adsorption electrode is provided in the inside of the ring holding member 113, a DC voltage may be applied to the electrode, so that the edge ring 13 may be adsorbed and held by the Coulomb force. In other words, the ring holding member 113 may be configured with an annular electrostatic chuck.

As described above, it is preferable that the upper surface height of the edge ring 13 placed on the upper surface of the ring holding member 113 substantially coincide with the upper surface height of the substrate W placed on the upper surface of the electrostatic chuck 112. In other words, it is preferable to determine the thicknesses of the ring holding member 113 and the edge ring 13 so that the upper surface height of the edge ring 13 substantially coincides with the upper surface height of the substrate W.

Further, the stage 11 may be formed with a gas passage (not illustrated) for supplying a heat transfer gas (back side gas), such as a helium gas, on a rear surface of the substrate W placed on the stage surface. A gas source (not illustrated) is connected to the gas passage. By supplying of the heat transfer gas from the gas source, the substrate W placed on the stage 11 may be controlled to a desired temperature.

As described above, the electrostatic chuck 112 and the ring holding member 113 are placed on an upper surface of the base 111 via the adhesive layer. The adhesive layer is consumed by the influence of radicals generated during the plasma processing, and thus there is a problem in that the electrostatic chuck 112 and the ring holding member 113 are peeled off from the base 111. Therefore, it is preferable to provide a sealing member 115 (for example, O-ring or the like) for protecting the adhesive layer from the plasma processing (radicals) in the stage 11. The sealing member 115 may be sandwiched by any two or more of the electrostatic chuck 112, the ring holding member 113, and the central stage 111c. For example, as shown in FIG. 3, when the upper surface height position of the central stage 111c is set to be higher than the upper surface height position of the ring holding member 113, the electrostatic chuck 112 having a diameter larger than that of the central stage 111c of the base 111 may be used as the electrostatic chuck 112, and the sealing member 115 may be provided at an overlapping portion between the electrostatic chuck 112 and the ring holding member 113 in a plan view. With the configuration, when the plasma processing is performed on the substrate W, exposure of the adhesive layer to the plasma can be reduced, so that consumption of the adhesive layer can be suppressed.

The disposition of the sealing member 115 is not limited to the example of FIG. 3 as long as the consumption of the adhesive layer due to radicals can be suppressed.

Figure 5:
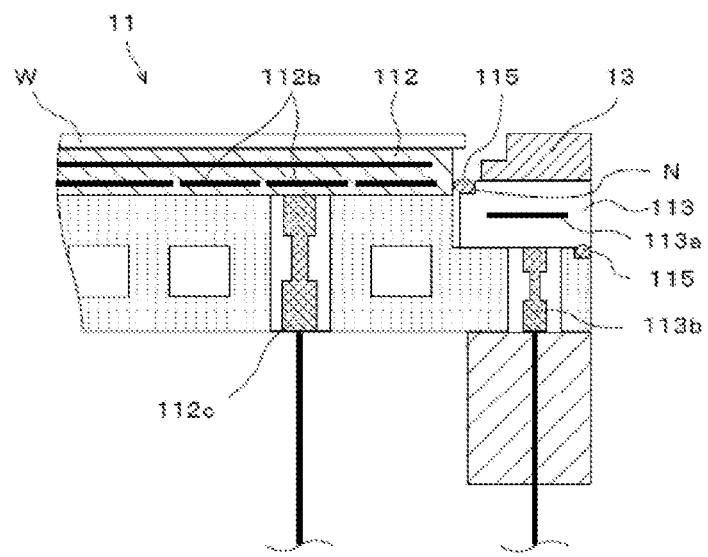
FIG. 5 is a main part enlarged view illustrating another example of an installation position of a sealing member in a substrate support illustrated in FIG. 2.

For example, as shown in FIG. 5, the sealing member 115 may be installed to be sandwiched between the electrostatic chuck 112 and the ring holding member 113 from a left and right (horizontal) direction. In this case, a notch N for holding the sealing member 115 may be formed at a contact portion between the sealing member 115 and the ring holding member 113, that is, at an upper portion of an inner peripheral surface of the ring holding member 113.

Figure 6:
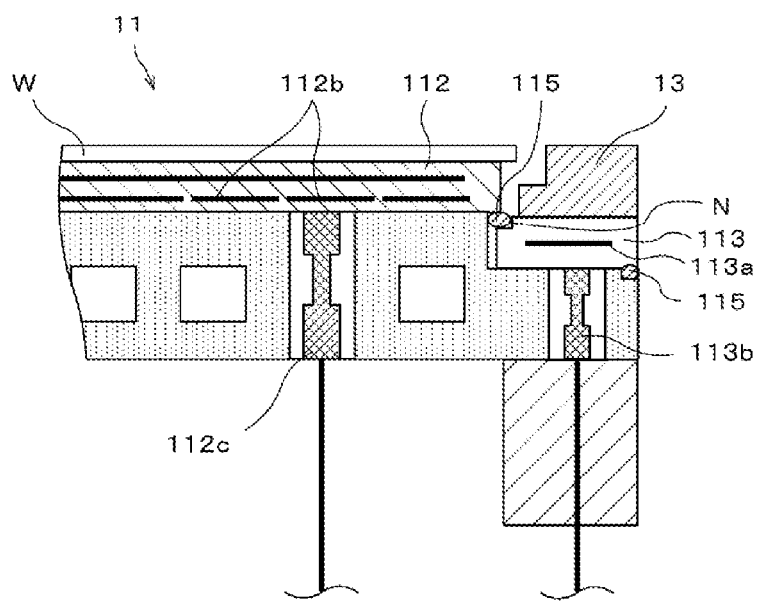
FIG. 6 is a main part enlarged view illustrating another example of the installation position of the sealing member in the substrate support illustrated in FIG. 2.

Further, for example, as illustrated in FIG. 6, the sealing member 115 may be installed to be sandwiched between the electrostatic chuck 112 and the ring holding member 113 from an up and down direction and the left and right (horizontal) direction. In this case, the notch N for holding the sealing member 115 may be formed at the upper portion of the inner peripheral surface of the ring holding member 113.

While various exemplary embodiments have been described above, various additions, omissions, substitutions and changes may be made without being limited to the exemplary embodiments described above. Indeed, the embodiments described herein may be embodied in a variety of other forms.

Operations and Effects of Stage of Present Embodiment

According to the stage 11 of the present embodiment, the height position of the outer peripheral stage 111e of the base 111 is set to a position lower than the height position of the central stage 111c; thus, the electrostatic chuck 112, on which the substrate W is placed on the upper surface, and the ring holding member 113, on which the edge ring 13 is placed on the upper surface, are separately configured. As a result, the thickness of the ring holding member 113 that holds the edge ring 13 and the thickness of the edge ring 13 itself can be changed independently of the electrostatic chuck 112.

According to the present embodiment, it is preferable to determine the thicknesses of the ring holding member 113 and the edge ring 13 such that the upper surface height of the edge ring 13 substantially coincides with the upper surface height of the substrate W. In this case, since the height position of the outer peripheral stage 111e is set to a position lower than the height position of the central stage 111c as described above, the thickness of at least either the ring holding member 113 or the edge ring 13 with respect to the thickness of the electrostatic chuck 112 can be set to be larger than in the related art.

Specifically, as described above, in a case where the height position of the central stage 111c is set to be higher than the upper surface height position of the ring holding member 113 placed on the outer peripheral stage 111e as illustrated in FIG. 3, the thickness of the edge ring 13 itself can be larger, as compared with the related art; more specifically, the thickness of the edge ring 13 can be equal to or larger than the thickness of the electrostatic chuck 112. Then, by increasing of the thickness of the edge ring 13 itself, it is possible to appropriately prolong the life of the edge ring 13.

Specifically, by increasing of the thickness of the ring holding member 113 (edge ring 13) in this way, it is possible to adjust the impedance ratio of the ring holding member 113 (edge ring 13) to the electrostatic chuck 112. That is, a heat input ratio to the edge ring 13 during the plasma processing is reduced, and thus the amount of consumption of the edge ring 13 is reduced, so that the life of the edge ring 13 can be more appropriately prolonged.

The present inventors now have performed diligent studies and have knowledge that the thickness of the ring holding member 113 is desirable to be equal to or larger than at least 40%, preferably equal to or larger than 50% of the thickness of the electrostatic chuck 112 from the viewpoints of the amount of consumption of the edge ring 13, the strength of the ring holding member 113, and the like. Based on the knowledge, in a case where the ring holding member 113 formed with a thickness corresponding to about half the thickness of the electrostatic chuck 112 in the related art is formed to have, for example, substantially the same thickness as that of the electrostatic chuck 112, the heat input ratio (the amount of consumption of the edge ring 13) to the edge ring 13 can be reduced by about 10%.

In order to properly perform the plasma processing with respect to the substrate W in the plasma processing system 1, it is necessary to maintain the uniformity of the in-plane temperature of the substrate W placed on the electrostatic chuck 112 and also maintain a desired temperature difference between the substrate W and the edge ring 13.

In this respect, according to the present embodiment, as described above, the electrostatic chuck 112, on which the substrate W is placed, and the ring holding member 113, on which the edge ring 13 is placed, are separately configured. Accordingly, in the plasma processing space 10s inside the plasma processing apparatus 1a, the electrostatic chuck 112 and the ring holding member 113 form a vacuum heat insulating structure, and the temperature of the electrostatic chuck 112 and the ring holding member 113 can be independently controlled, so that it is possible to appropriately maintain the temperature difference between the substrate W and the edge ring 13.

Figure 4:
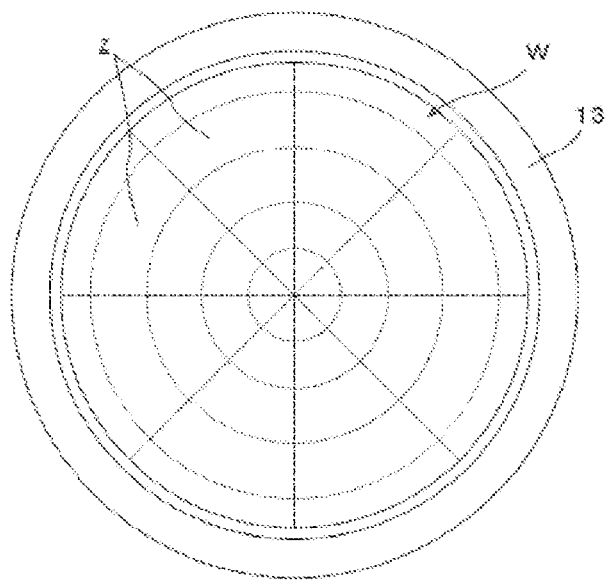
FIG. 4 is a plan view illustrating a division example of a temperature-controlled region on which temperature control is independently performed by a heater.

Further, according to the embodiment illustrated in FIG. 4, the electrostatic chuck 112 (the substrate W) is configured to be able to independently adjust temperatures of the plurality of substrate temperature-controlled regions Z by the plurality of substrate heater electrodes 112b provided in the inside of the electrostatic chuck 112. Accordingly, it is possible to appropriately maintain the uniformity of the in-plane temperature of the surface (the substrate W) of the electrostatic chuck 112.

Specifically, the present inventors made a study as follows: the surface temperature of the electrostatic chuck 112 was managed to be controlled to be about 20 degrees while the surface temperature of the ring holding member 113 was kept to be about 90 degrees (control of the temperature difference between the substrate W and the edge ring 13). Further, the variation in the surface temperature of the electrostatic chuck 112 can be controlled to be within Δ1.5 degrees (uniform control of the in-plane temperature of the substrate W). That is, the uniformity of the in-plane temperature of the substrate W was managed to be ensured while the desired temperature difference was ensured between the substrate W and the edge ring 13.

In the embodiment described above, a case where the second power feeding terminal 113b that applies a voltage to the heater 113a, and the DC power source (not illustrated) that applies a DC voltage to the edge ring adsorbing electrode may be connected to the ring holding member 113 has been described as an example. However, for example, in a case where the edge ring 13 is consumed by the plasma processing, a DC power source (not illustrated) for applying the DC voltage to the ring holding member 113 may be further connected to the ring holding member 113.

In a case where the upper surface height position of the edge ring 13 changes due to the consumption of the edge ring 13, a sheath shape formed during the plasma processing changes accordingly. Specifically, due to the consumption of the edge ring 13, a step difference is generated between the sheath height of the substrate W and the sheath height of the edge ring 13. Then, in a case where the sheath shape changes in this way, the accuracy of the plasma processing may be deteriorated.

Therefore, by applying of a DC voltage from the DC power source to the ring holding member 113 in a case where the edge ring 13 is consumed as described above, it is possible to cancel the change in the sheath shape caused by the consumption of the edge ring 13. More specifically, in a case where the DC voltage, which is applied to the edge ring 13 according to the consumption of the edge ring 13, is adjusted, the sheath height of the edge ring 13 can be adjusted, and thus the sheath height of the substrate W and the sheath height of the edge ring 13 can be aligned.

A method for applying the DC voltage to the edge ring 13 from the DC power source is not particularly limited. For example, the DC voltage may be applied to the edge ring 13 when the amount of consumption of the edge ring 13 is large (in a case where the sheath height of the edge ring 13 is equal to or less than a predetermined threshold value), and the application of the DC voltage may be stopped in a case where the amount of consumption of the edge ring 13 is small (in a case where the sheath height of the edge ring 13 exceeds the predetermined threshold value).

Further, when the amount of consumption of the edge ring 13 is large (when the sheath height of the edge ring 13 is equal to or less than a predetermined threshold value), the DC voltage that is applied to the edge ring 13 may be changed stepwise or continuously.

It shall be understood that the embodiments disclosed herein are illustrative and are not restrictive in all aspects. The embodiment described above may be omitted, replaced, or modified in various forms without departing from the scope and spirit of the appended claims.

For example, in the plasma processing system 1 of the embodiment described above, a case where Capacitively Coupled Plasma (CCP) is generated in the plasma processing apparatus 1a has been described as an example; however, the plasma generated in the plasma processing apparatus 1a may be Inductively Coupled Plasma (ICP).

According to the present disclosure, in the edge ring disposed around the substrate supported by the substrate support, it is possible to appropriately reduce the amount of consumption of the edge ring during plasma processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate support disposed inside a substrate processing apparatus for performing plasma processing on a substrate, the substrate support comprising: a substrate support portion having an electrostatic chuck for adsorbing the substrate and a substrate heater electrode in the electrostatic chuck; a ring support supporting an edge ring disposed to surround the substrate and having an edge ring heater electrode inside; a base having a central stage on which the substrate support portion is disposed, and an outer peripheral stage on which the ring support is disposed on an outer peripheral side of the central stage; a first power feeding terminal disposed immediately below the substrate support portion to supply a power to the substrate heater electrode; and a second power feeding terminal disposed immediately below the ring support to supply the power to the edge ring heater electrode, wherein an upper surface of the outer peripheral stage is positioned lower than an upper surface of the central stage, and a thickness of the ring support is equal to or larger than 40% of a thickness of the substrate support portion.

2. The substrate support according to claim 1, wherein the thickness of the ring support is equal to or larger than 50% of the thickness of the substrate support portion.

3. The substrate support according to claim 1, wherein the upper surface of the central stage is positioned above an upper surface of the ring support placed on the outer peripheral stage.

4. The substrate support according to claim 1, wherein a thickness of the edge ring is thicker than the thickness of the substrate support portion.

5. The substrate support according to claim 1, further comprising: a DC power source configured to apply a DC voltage to the ring support so as to cancel a change in a sheath shape caused by consumption of the edge ring in a case where the edge ring is consumed due to the plasma processing.

6. The substrate support according to claim 5, wherein the DC power source applies the DC voltage to the edge ring when an amount of consumption of the edge ring exceeds a predetermined threshold value.

7. The substrate support according to claim 1, wherein the electrostatic chuck is divided into a plurality of regions in a plan view, the substrate heater electrode is configured by a plurality of segment electrodes, and each of the plurality of segment electrodes is disposed for each of the plurality of regions.

8. The substrate support according to claim 7, wherein respective powers supplied to the plurality of segment electrodes are independently controllable.

9. The substrate support according to claim 1, wherein a plurality of the edge ring heater electrodes are provided.

10. The substrate support according to claim 1, wherein the substrate support portion and the ring support are placed on the base via an adhesive layer, and the substrate support further comprises a sealing member that is sandwiched by any two or more of the electrostatic chuck, the ring support, and the central stage, and that suppresses exposure of the adhesive layer to plasma when the substrate is subjected to the plasma processing.

11. The substrate support according to claim 1, wherein the ring support includes an electrostatic chuck for adsorbing the edge ring.

12. A substrate processing apparatus for processing a substrate, the substrate processing apparatus comprising: a processing chamber configured to process the substrate inside; and the substrate support according to claim 1, which is disposed inside the processing chamber to support the substrate.

13. A substrate support comprising: a substrate support portion for supporting a substrate, having a first dielectric, and a substrate adsorption electrode and a substrate bias electrode inside the first dielectric; a ring support supporting an edge ring disposed to surround the substrate, and including a second dielectric, and an edge ring bias electrode inside the second dielectric; and a base having a central stage on which the substrate support portion is disposed, and an outer peripheral stage on which the ring support is disposed on an outer peripheral side of the central stage, wherein an upper surface of the outer peripheral stage is positioned lower than an upper surface of the central stage, and a thickness of the ring support is equal to or larger than 40% of a thickness of the substrate support portion, wherein the substrate support portion further includes a substrate heater electrode for heating the substrate, and the ring support further includes an edge ring heater electrode for heating the edge ring; and a first power feeding terminal disposed immediately below a lower side of the substrate support portion to supply a power to the substrate heater electrode, and a second power feeding terminal disposed immediately below a lower side of the ring support to supply the power to the edge ring heater electrode.

14. A substrate support comprising: a substrate support portion for supporting a substrate, having a first dielectric and a first electrode inside the first dielectric, the first electrode is a substrate heater electrode for heating the substrate; a ring support for supporting an edge ring disposed to surround the substrate and having a second dielectric and a second electrode inside the second dielectric, the second electrode is an edge ring heater electrode for heating the edge ring; and a base having a central stage on which the substrate support portion is disposed and an outer peripheral stage on which the ring support is disposed on an outer peripheral side of the central stage, wherein an upper surface of the outer peripheral stage is positioned lower than an upper surface of the central stage, and a thickness of the ring support is equal to or larger than 40% of a thickness of the substrate support portion; and a first power feeding terminal disposed immediately below a lower side of the substrate support portion to supply a power to the substrate heater electrode, and a second power feeding terminal disposed immediately below a lower side of the ring support to supply the power to the edge ring heater electrode.

15. The substrate support according to claim 14, wherein the first electrode includes at least one other electrode selected from the group consisting of a substrate adsorption electrode, a substrate heater electrode, and a substrate bias electrode.

16. The substrate support according to claim 14, wherein the second electrode includes at least one other electrode selected from the group consisting of an edge ring adsorption electrode, an edge ring heater electrode, and an edge ring bias electrode.

* * * * *